Oct. 11, 1966 T. C. NEW ETAL 3,277,957

HEAT TRANSFER APPARATUS FOR ELECTRONIC COMPONENT

Filed April 3, 1964

WITNESSES:

John G. Chopp

Lorn M. Garman

INVENTORS

Thorndike C. New, William A. Stewart, Herbert E. Ferree and Thomas P. Nowalk

BY

Gordon H. Telfer

ATTORNEY

United States Patent Office 3,277,957
Patented Oct. 11, 1966

3,277,957
HEAT TRANSFER APPARATUS FOR ELECTRONIC COMPONENT

Thorndike C. New, Hempfield Township, Greensburg, William A. Stewart, Pittsburgh, Herbert E. Ferree, Greensburg, and Thomas P. Nowalk, Irwin, Pa., assignors to Westinghouse Electric Corporation, Pittsburgh, Pa., a corporation of Pennsylvania Filed Apr. 3, 1964, Ser. No. 357,103
4 Claims. (Cl. 165—80)

This invention relates generally to apparatus for the removal of heat from an electronic component and, more particularly, relates to a semiconductor device encapsulation that has as an integral part thereof a heat exchanger. The invention further relates to methods for fabricating a heat exchanger integral with a semiconductor device housing.

It has previously been the usual case that with semiconductor devices intended for power application, that is where power dissipation in excess of about 100 watts is encountered, removal of heat from the working portion of the device has been a serious problem. Usually, the capabilities of the device are limited by the ability of maintaining the maximum allowable temperature at the active junctions. The ultimate failure of the device often results from thermal destruction if the temperature limits are exceeded.

In prior designs, the power device, such as a rectifier, transistor or controlled rectifier, was mounted onto a threaded stud of high conductivity material such as copper. The threaded stud would in use be inserted by the user of the device into an aperture of a heat exchanger, commonly referred to as a heat sink, with the threaded stud being secured to the heat sink by a nut.

Such a configuration has undesirable thermal characteristics for several reasons. Among them are that the stud diameter restricts the thermal path to its contact surface cross sectional area. The interface between the mounted device and the heat sink imposes another barrier to the heat flow. Furthermore, in order to provide the use of a spring washer and a nut to maintain the contact pressure under thermal cycling in service, the heat flow must be carried through a relatively thin member before reaching the cooling fins. Although some heat sinks are made with female threads to accept the semiconductor device without the spring washer or the nut and thereby improve the heat flow, they could easily lose proper contact pressure on thermal cycling due to normal operating conditions.

Considerable improvement in the thermal impedance between the device and seat sink can be provided in eliminating or minimizing the contact barrier by avoiding the use of a threaded stud and having the device integral with a heat sink. In so doing, it also permits the use of a slug of large cross sectional area to distribute the heat flow to each cooling fin with minimum thermal impedance. However, substantial problems in fabrication are encountered when it is intended to mount a device directly onto a completely fabricated heat sink because of the large area of the heat sink and large bulk that would be required to be taken through the various process stages to which the device is subjected.

It is therefore an object of the present invention to provide improved heat transfer apparatus for an electronic component.

Another object is to provide an integral heat sink for a power semiconductor device which substantially improves the power handling capability of the semiconductor device.

Another object is to provide a method of fabricating a heat sink integral with an electronic component that does not interfere with the assembly operations required for the electronic component.

The present invention, in brief, achieves the above-mentioned and additional objects and advantages by apparatus comprising a first member, or slug, of generally cylindrical configuration having a device mounting surface at one end thereof. A plurality of fins for heat dissipation are disposed around the cylindrical surface of the slug; the fins and the slug are of a ductile and thermally conductive material, preferably copper, and are secured in a tight mechanical contact of low thermal impedance by an interference fit.

In accordance with another aspect of the present invention, the integrated heat sink is fabricated by a method including the steps of mounting an electronic component onto an end surface of a generally cylindrical slug member in a hermetic enclosure and only after the mounting on the component, cooling fins are affixed to the slug. The manner of attaching the fins is by placing over the opposite end of the slug member a cooling fin having an aperture slightly greater than the diameter of the slug with the portion of the cooling fin at the periphery of the aperture being upset by an amount such that when the entire fin is planar the aperture has a diameter less than that of the cross section of the slug. Pressure is applied to the fin member around the slug so as to deform the fin substantially into a plane and to bring the peripheral portion of the fin at the aperture into a tight interference fit with the slug.

In accordance with other features of the present invention, a top plate is provided substantially more massive than the individual heat convecting fins and is disposed proximate to the surface on which the electronic component is mounted to provide a means for mechanically mounting the integrated structure as well as providing heat convection. The top plate is also secured to the slug by an interference fit. Additionally, a spacer is provided between each adjacent pair of fins to assist in the formation of the interference fit between the fins and the slug. It may also be desirable, but is not necessary, to provide a small amount of solder next to the interface between the fins and slug primarily for the purpose of preventing such interface from becoming contaminated by material which would increase the thermal impedance. It is not necessary to employ solder for mechanical reasons.

The present invention, together with the above-mentioned and additional objects and advantages thereof, will be better understood by referring to the following description together with the accompanying drawings wherein.

Figures 1, 2, 3, 4:
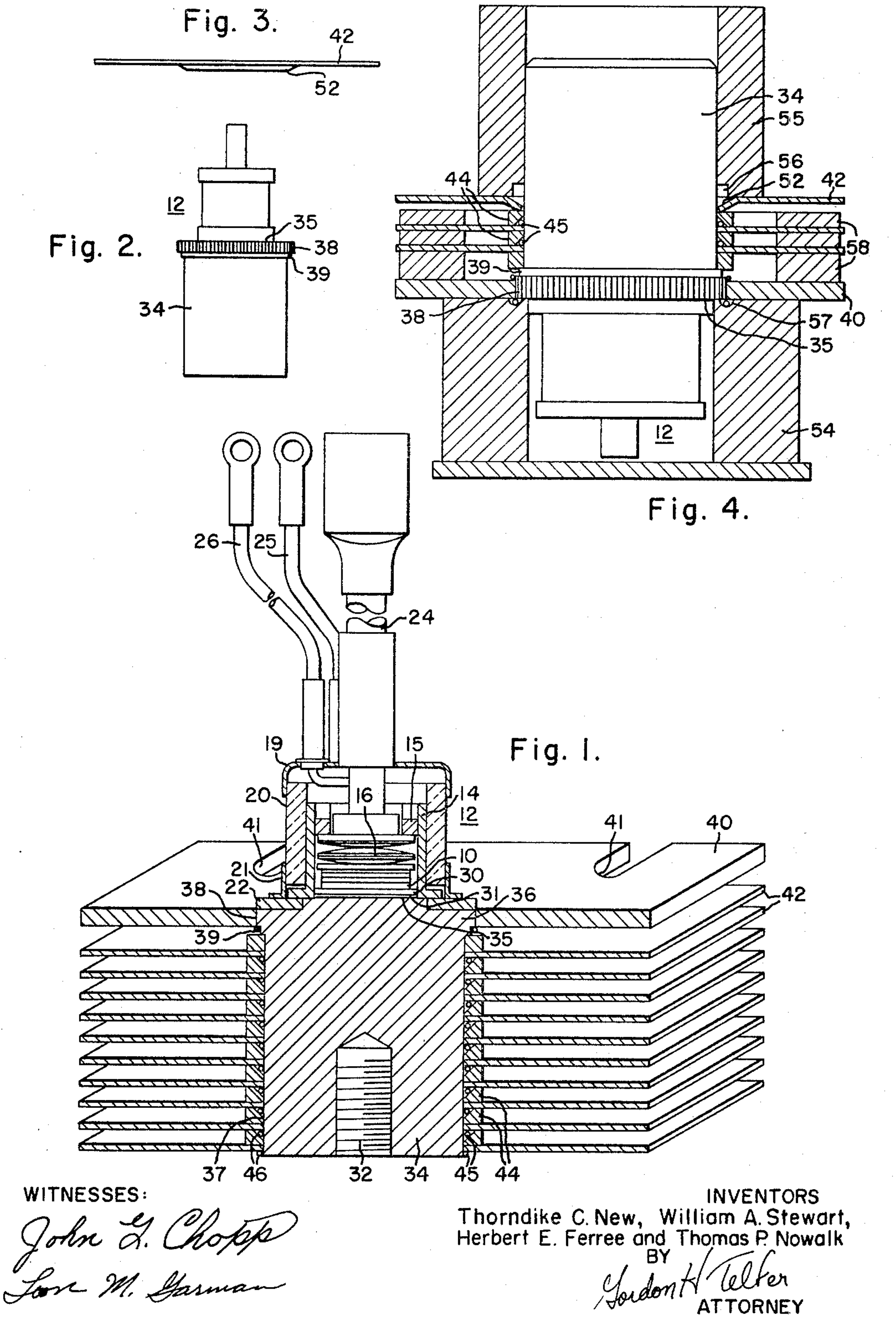
FIGURE 1 is a perspective view in cross-section of a semiconductor device and integral heat sink in accordance with the present invention.
FIGS. 2 and 3 are sectional views of elements of the integrated structure of FIG. 1 prior to fabrication.
FIG. 4 is an elevation view of the integrated structure during the fabrication process.

Referring now to FIG. 1, an example of a structure in accordance with the present invention is illustrative including an electronic component 10 that in this example is a semiconductor device and, more particularly, a silicon controlled rectifier. As the nature of the silicon controlled rectifier, or other electronic component, employed in the integrated structure in accordance with this invention is not itself a novel feature of the invention, it will not be described in detail herein. For a description of a silicon controlled rectifier structure suitable for utilization in the practice of the present invention reference should be made to Stein et al. Patent 2,980,832, issued April 18, 1961.

The controlled rectifier 10 is within a hermetic enclosure 12 that, in this example, utilizes a compression bonded encapsulation mechanism therein for securing the controlled rectifier 10 and making electrical and thermal contact to it. This portion of the structure includes an inner housing member 14 that is cylindrical and engages by screw threads on its inner surface an annular threaded member 15 that bears against a stack of springs 16 and the controlled rectifier 10.

The structure also includes an outer housing including a metal cap 19, a ceramic sleeve 20, a flanged metal sleeve 21 and a weld ring 22 that are successively secured together to cooperate to provide the hermetic enclosure for the controlled rectifier 10.

Extending from the hermetic enclosure 12 are a cathode power lead 24, a cathode signal lead 25 attached to the cathode power lead 24 and a gate signal lead 26, each of the leads having suitable terminals at the ends thereof.

As the nature of the hermetic enclosure is not in itself a novel feature of the present invention it will not be described in further detail herein. For further information with respect to a hermetic enclosure of the type illustrated including a compression bonded encapsulation mechanism reference should be made to copending application Serial No. 232,546, filed October 23, 1962 by Krawczykiewicz et al. and assigned to the assignee of the present invention.

It will be understood that in an integrated electronic component and heat sink structure in accordance with this invention it is not necessary to employ compression bonded encapsulation since other means for securing the electronic component and making thermal and electrical contact may be employed including that frequently referred to in the semiconductor art as "hard soldering" techniques. For further information on the practice of such techniques, reference should be made to copending application Serial No. 11,675, filed February 29, 1960 by Green and assigned to the assignee of the present invention. Those techniques commonly referred to as "soft soldering" may also be employed for the device mounting.

In the example of FIG. 1, the controlled rectifier 10 is bonded to a first thermally conductive member 30 of a material, such as molybdenum, having a thermal coefficient of expansion similar to that of the semiconductive material of the device 10. The member 30 is a thin flat disc on the lower surface of which a member 31, of silver, for example, enables compression bonding to a thermally conductive member or slug 34 at a first surface 35 thereof. The member or slug 34 is of a good thermally conductive material that is also ductile such as copper, copper base alloys, aluminum and aluminum base alloys, and has a generally cylindrical configuration with the device mounting surface 35 at one end thereof. The cross-sectional configuration of the slug 34 may conveniently be circular although other configurations are suitable such as square or hexagonal. The hermetic enclosure 12 of the semiconductor device is secured to a portion or shoulder 36 at the same end as the device mounting surface 35. The slug member 34 is itself a part of the hermetic enclosure for the device 10. If an intermediate member were employed for this purpose, an additional, undesirable thermal interface would be introduced.

The cylindrical surface 37 of the device is for the application of heat convecting fins thereto as will be subsequently described. Near the portion 36 of member 34 a slightly offset portion 38 of larger diameter than the cylindrical surface 37 is provided for application of a top plate thereto as will be subsequently described. A shoulder 39 is provided between the offset portion 38 and the surface 37. Within the lower end of the member 34 is a threaded aperture 32 adapted for the attachment of an anode lead to the controlled rectifier 10.

The heat transfer apparatus includes a plurality of heat convecting structures extending outwardly from the cylindrical surface of the slug 34. These include a top plate 40 of substantial thickness such as about 5/32 inch to provide means for mechanically securing the structure in its desired position for use. The remaining heat convecting members are relatively thin fins 42 extending parallel to the top plate. The top plate includes notches 41 for securing the structure. The top plate 40 and fins 42 are of thermally conductive and ductile material such as copper. Between each pair of adjacent fins 42 and between the top plate and the adjacent fin is a spacer 44 of a material such as brass. Each spacer 44 has a chamfer 45 at one corner of the inner periphery thereof in which is disposed a solder ring 46 with the exception of the first spacer adjacent the top plate 40.

The top plate 40 and the fins 42 are mechanically secured to provide low thermal impedance to the slug 34 by an interference, or pressed, fit. By the expression interference fit, or pressed fit, is meant that the materials of the fins 42, or top plate 40, and that of the slug 34 are in physical interference by reason of the interfering dimensions of the elements. Typically, the fins 42 and top plate 40 have apertures of a diameter that is less than the original diameter of the slug 34 by about 5 to 20 mils. The exact nature of the bond between the top plate 40 and the slug 34 or the fins 42 and the slug 34 is not critical except that good mechanical security is required to provide a low thermal impedance path. Whether the materials of the press fitted elements flow together in the manner of a weld is not necessary to the present invention since it is not essential that a hermetic seal be provided between the elements.

The spacers 44 provide a means for fabricating the structure as will be subsequently described. It is possible to remove the spacers after the structure is formed without deterioration of the thermal or mechanical properties of the structure but they may remain in place without interfering with performance. The solder rings 46, one of which is also disposed at the outside of the bottom fin 42, are primarily for the purpose of protecting the joint between the fins and the slug from contaminants that might interfere with the thermal path. The solder rings 46 are not required for mechanical strength and may be omitted if desired without serious impairment of performance.

In the structure in accordance with this invention the contact surface 35 between the controlled rectifier 10 and the slug 34 of the heat sink is large and has no restrictions, hence the thermal drop is much reduced through this region. In the slug 34 itself, the cross section is great, compared to conventional structures with a threaded stud, and the cross section for heat flow is greatly increased. Furthermore, the heat flow between the slug 34 and the cooling fins 42 is well distributed over the large area surface 37 of the slug 34. Furthermore, the length and the cross section of the slug is selected for maximum total cooling for a specified mass of metal. Therefore the total thermal impedance of the device is minimized. Such a design was built and tested with a high power silicon controlled rectifier having a power dissipation of 400 watts. The total thermal drop from the device junction to ambient was found to be less than 0.22° C. per watt at 1500 ft. per minute air velocity compared with 0.3° C. per watt or more for the same type of device secured to a heat sink by a threaded stud. For a device with 400 watt dissipation and 125° C. at the junction, the improved heat sink will permit an ambient temperature of 37° C. against the conventional design that requires an impractical, if not impossible, 5° C. ambient.

The method of the present invention permits assembling the heat radiating fins 42 and top plate 40 onto the slug 34 as a last step in the fabrication process which greatly facilitates the making of the hermetic enclosure for the semiconductor device. This method of attachment also provides more economical use of materials than would be the case if the slug and heat dissipating members were machined from a unitary body of material. Also the fact that the fins are mounted as the last step eliminates the danger of distorting their shape. The fins can therefore be disposed at a uniform spacing designed to provide maximum heat transfer.

FIG. 2 illustrates, in general outline, the structure after the hermetically enclosed semiconductor device has been formed on the slug member 34. The reference numerals are the same as those used for the corresponding elements of FIG. 1. Some details of the structure have been omitted for clarity but it is to be understood that the complete hermetic enclosure 12 is formed with lead attachment to the upper surface of the semiconductor device prior to this stage.

As a next step the planar top plate 40 is mounted on the structure by insertion over the slug and press fit against the knurled edge of the offset portion 38 of the slug 34.

FIG. 3 illustrates a cross section of a fin member 42 prior to assembly onto the slug. The fin 42 has an aperture whose original diameter is less than that of the slug member by about 3 to 20 mils. The portion 52 of the fin at the perimeter of the aperture is upset at an angle of about 30° so that the fin readily slides over the slug 34 into position.

Between each pair of adjacent fins 42 and between the top plate 40 and the adjacent fin there is inserted over the slug 34 a spacer 44, with or without a solder ring 46 as previously described. The spacer may be a split ring and need not adhere tightly to the slug surface.

FIG. 4 illustrates the manner of assembly of these elements. The fin 42 is placed over the slug in an inverted position so that the upset portion 52 is disposed toward the top plate 40. This is necessary so that the operation in which the fin 42 is straightened and brought into interference with the slug 34 may be performed without damage to the surfaces of the elements involved. After placing the fin 42 over the slug 34, pressure is applied to the fin to force it to be flattened. Because of the smaller diameter of the flattened fin a tight interference fit is made with the surface 37 of slug 34.

As shown in FIG. 4, the slug 34, inverted, rests on a support sleeve 54 of a material such as steel. A pressing sleeve 55 is used to press fit the top plate 40 onto the portion 38 of the slug. The shoulder 39 is for aligning the top plate 40. A notch 56 is provided in the end of the pressing sleeve 55 so the sleeve can move past the shoulder 39. The support sleeve 54 has a notch 57 for receiving metal chips when the top plate 40 is joined to the slug. Spacer plates 58 are inserted between each adjacent pair of fins and the top plate to limit the movement of the fins when being press fit.

In addition to employing a solder ring for the protection of the structure, it is also convenient to protect the structure by using, for example, an epoxy resin black paint.

Further details for the fabrication of the structure such as that illustrated in FIG. 1 will now be described. The slug member 34 was of copper including about 0.5% tellurium available as CABRA No. 145, about 2½ inches long and 1⅞ inches diameter. The device 10 was mounted thereto using a steel weld ring 22 of rectangular cross section and a hard solder (silver alloy) preform. The slug 34, the weld ring 22 and the solder preform were machined to the desired configuration, the parts cleaned, and brazed in a furnace containing a hydrogen atmosphere at temperature of about 900° C. Then the pedestal of the slug was fly-cut. The mounting surface 35 was silver plated and annealed overnight at 250° C. The internal housing 14 was welded to the steel weld ring 22 by electrical resistance heating, the assembly was vacuum baked and the semiconductor device 10 and the compression bonded encapsulation mechanism was placed within the inner housing 14. The external cap of elements 19, 20 and 21 was welded over the structure and the entire assembly tin plated. In addition to the foregoing, operations were performed for the attachment of the leads to the semiconductor device.

The top plate was of copper of about 5⁄32 inch thickness and 4 x 5 inches area. It was tin plated over its entire surface.

The fins 42 were of about .0485 inch in thickness and 4 x 5 inches area. They were cut to size, the center aperture punched, the upset formed and tin plated. The spacers were of yellow brass tubing having a 2 inch outer diameter and 1¾ inch inner diameter which were also tin plated.

Solder preforms were employed of 60-40 tin-lead multicore solder having a noncorrosive flux. The solder preforms had a diameter of about .048 inch.

About 20 mils interference existed between the diameter of the top plate 40 and the knurled portion 38 of the slug 34. The original flat fin and the diameter of the slug 34 had about 8 mils interference. The top plate was pressed on the knurled edge of the offset portion 38 of the slug using approximately 8000 pounds of force. A solder preform was placed over the slug next to the top plate, then a plate 58 was placed over the slug. A fin 42, with the upset portion projecting toward the top plate, and a sleeve type tool 55 was put in place and used to press onto the spacer 44 and jig member 58 with approximately 1500 pounds force to flatten the fin and bring it into interference fit with the slug 34. Then a solder preform 45, spacer 44, spacer plate 58, and fin 42 were placed over the slug 34 in that order and pressed and the operation repeated until a total of 10 fins had been disposed on the slug member. A solder preform was placed on the last fin and the structure baked in an air oven at 200° C. to fuse the solder. The assembly was then painted with an epoxy black paint and baked 30 minutes at 150° C.

While the present invention has been shown and described in a few forms only, it will be understood that various changes may be made without departing from the spirit and scope thereof.

What is claimed is:

1. Apparatus for heat removal from a heat generating component comprising: a first member having a first surface for mounting a heat generating component thereon and a second surface extending in a generally perpendicular direction with respect to said first surface; a plurality of fins for heat dissipation disposed around said first member, said fins each having an aperture substantially conforming to the sectional configuration of said first member, said fins and said first member being of ductile and thermally conductive material with the entire periphery of said fin aperture contacting said first member in an interference fit; a plurality of spacer members each disposed between an adjacent pair of fin members, said spacer members fitting on said first member less tightly than said fins fit on said first member.

2. Apparatus in accordance with claim 1 wherein: said first member is substantially a right circular cylinder; said fins and spacers have substantially circular apertures and further comprising a solder ring between each of said fins and an adjacent one of said spacers substantially to prevent contamination of said second surface.

3. In combination: a semiconductor device having a bottom surface; a first conductive member bonded to said bottom surface; a second conductive member having a generally cylindrical configuration with a first surface at a first end thereof; said first conductive member bonded to said first surface of said second conductive member; said second conductive member having a second, cylindrical, surface; a plurality of heat dissipating fin members extending from said cylindrical surface; each of said fins engaging said cylindrical surface in an interference fit; a top plate of conductive material disposed parallel to said fin members and joined to said second conductive member proximate to said first end in an interference fit; said top plate being substantially more massive than each of said fin members to permit rigid mechanical mounting; a plurality of spacer members each disposed between an adjacent pair of fin members, said spacer members fitting on said cylindrical surface of said second member less tightly than said fins fit on said first member.

4. In a combination as in claim 3: said semiconductor device is a controlled rectifier; said first conductive member is a thin, flat disk of a material having a coefficient of thermal expansion similar to that of the semiconductive material of said semiconductor device; a hermetic enclosure containing said semiconductor device comprising a housing member secured to said first end by a hard solder joint.

References Cited by the Examiner

UNITED STATES PATENTS

| | | | |
|---|---|---|---|
| 2,400,157 | 5/1946 | Merry | 165—182 X |
| 2,752,541 | 6/1956 | Losco | 317—234 |
| 3,033,537 | 5/1962 | Brown | 165—80 |
| 3,086,283 | 4/1963 | Webber et al. | 29—157.3 |
| 3,100,332 | 8/1963 | Gier | 29—157.3 |
| 3,137,342 | 6/1964 | Katz | 165—80 |
| 3,209,218 | 9/1965 | Zielasek et al. | 317—234 |

FOREIGN PATENTS

| | | |
|---|---|---|
| 204,741 | 11/1956 | Australia. |

ROBERT A. O'LEARY, *Primary Examiner.*

CHARLES SUKALO, *Examiner.*

A. W. DAVIS, *Assistant Examiner.*